United States Patent [19]

Yabe et al.

[11] Patent Number: 5,698,876
[45] Date of Patent: Dec. 16, 1997

[54] MEMORY STANDARD CELL MACRO FOR SEMICONDUCTOR DEVICE

[75] Inventors: Tomoaki Yabe; Shinji Miyano; Katsuhiko Sato; Kenji Numata, all of Kanagawa-ken, Japan

[73] Assignee: Kabushiki Kaisha Toshiba, Japan

[21] Appl. No.: 576,477

[22] Filed: Dec. 21, 1995

[30] Foreign Application Priority Data

Jan. 31, 1995 [JP] Japan ................. P07-013738

[51] Int. Cl.$^6$ ........................... H01L 27/108
[52] U.S. Cl. ............... 257/296; 257/204; 257/369; 257/390; 257/909; 365/230
[58] Field of Search ................. 257/204, 296, 257/369, 390, 909; 365/230

[56] References Cited

U.S. PATENT DOCUMENTS 4,295,149 10/1981 Balyoz ...................... 257/211

Primary Examiner—Edward Wojciechowicz
Attorney, Agent, or Firm—Banner & Witcoff, Ltd.

[57] ABSTRACT

A semiconductor device of a memory-macro type can be designed within a short time to have a desired storage capacity, which does not occupy a large area, so as to reduce the chip cost. The semiconductor device includes a memory macro having sub-memory macros, each sub-memory macro having a DRAM memory-cell array, and a row decoder and a column decoder for selecting any desired memory-cell from the memory cell of the array. The memory macro also includes a control-section macro having a DC potential generating circuit for generating various DC potentials required to drive the sub-memory macros. At least one of the sub-memory macros is combined with the control-section macro to form the memory macro as a one-chip memory capable of storing an integral multiple of N bits.

9 Claims, 14 Drawing Sheets

MEMORY STANDARD CELL MACRO FOR SEMICONDUCTOR DEVICE

BACKGROUND OF THE INVENTION

1. Field of the Invention

The present invention relates to a semiconductor memory device, and more particularly, to a semiconductor device including a memory macro standard cell and a logic circuit section formed of a gate array or standard cells.

2. Description of Related Art

A conventional one-chip, logic semiconductor memory device will be described, with reference to FIG. 15. This logic semiconductor memory device includes a logic section and a semiconductor memory macro (hereinafter called "memory macro"), all formed on a semiconductor chip. The logic section is formed of a gate array or standard cells. The device shown in FIG. 15 is a typical type, an embedded memory.

As shown in the figure, a pad-I/O (input/output) section 151 is provided on the peripheral portion of the semiconductor chip 150. Arranged inside the pad-I/O section 151 is a gate-array section 156 which includes various control circuits. The gate-array section 156 has been manufactured by forming P-channel MOS transistors and N-channel MOS transistors in great numbers on a semiconductor substrate, and then forming wires, preferably of aluminum or polysilicon, in one of the final steps of manufacturing semiconductor integrated circuit, thereby connecting the sources, drains and gates of these MOS transistors, so that the resultant gate array may perform a desired function. The gate-array section 156 may be replaced by a standard-cell section in some cases.

In the central part of the gate-array section 156 there are provided a memory macro 157 and macro cells 158 and 159. The memory macro 157 functions as a memory. The macro cells 158 and 159 function as circuits. The memory macro and the macro cells are circuit modules selected from prefabricated ones generally called "library." The macro cells are, for example, PLL (Phase Locked Loop) circuit modules or the like.

The storage capacity required of the memory macro 157 is defined by the use of the chip. The memory macro 157 is constituted by a plurality of sub-memory macros 160 as illustrated in FIG. 16. More precisely, the memory macro 157 is comprised of four sub-memory macros 160 (i.e., sub-memory macros 1 to 4). Each sub-memory macro 160 operates as an independent memory. In other words, data i is input into and output from each sub-memory macro as address i (i=1 to 4) and a control signal i is supplied to the sub-memory macro. To impart a storage capacity of 8 megabits to the memory macro, it suffices to combine four sub-memory macros each having a storage capacity of 2 megabits. Thus, memory macros having various storage capacities can be designed and provided within a short period of time.

FIG. 17 shows a conventional sub-memory macro. This example is of a DRAM-structure and used as one of the sub-memory macros 160. The sub-memory macro includes a DRAM memory-cell array 21, a row-address buffer 22, a row-system control circuit 23, a row decoder 24, a column-address buffer 25, a column-system control circuit 26, a column decoder 27, a sense amplifier circuit 28, a column-gate circuit 29, a data input-output buffer 30, a word-line boosting circuit 31, and a DC potential generating circuit 32.

The DC potential generating circuit 32 is a particular component for use in a DRAM. It generates, for example, three kinds of DC potentials VBB, VBL and VPL. The DC potential VBB is a bias potential which is applied to the P-well region of the semiconductor substrate to set the N-channel MOS transistors provided in the P-well region at a predetermined threshold voltage. The DC potential VBL is a potential for charging the bit fines. The DC potential VPL is a potential to be applied to the plate electrodes of the capacitors incorporated in DRAM memory cells. The DC potential generating circuit 32 which generates these three types of DC potentials VBB, VPL and VBL, and the word-line boosting circuit 31 which generates the word-line potential are provided in each of the sub-memory macros 160.

Generally, the DC potential generating circuit 32 and the word-line boosting circuit 31 occupy a large area on a semiconductor chip. The conventional memory macro having these components inevitably has a large surface area, which increases the chip cost.

SUMMARY OF THE INVENTION

It is an object of the present invention to provide a semiconductor device of memory-macro type which can be designed within a short time to have a desired storage capacity. Also, it is a further object of the present invention to provide a semiconductor device which does not occupy a large area, reducing the chip cost.

These and other objects are achieved in a semiconductor device according to the present invention in which the semiconductor device includes a logic circuit section formed of either a gate array or standard cells, sub-memory macros having a memory-cell array capable of storing N bits and a selection circuit for selecting any of the memory cells of the memory-cell array, and a control-section macro having potential-generating means for generating various DC potentials required for driving the sub-memory macros, wherein at least one of the sub-memory macros is combined with the control-section macro, forming a one-chip memory capable of storing an integral multiple of N bits.

Also, these and other objects are achieved in another aspect of the present invention, wherein there is provided a semiconductor device that includes a logic circuit section formed of either a gate array or standard cells, sub-memory macros having word lines arranged in row direction, bit lines arranged in column direction, a memory-cell array capable of storing N bits and formed of N memory-cells connected to the word lines and the bit lines, and a selection circuit for selecting any of the memory-cells of the memory-cell array, and a control-section macro having word-line potential generating means for generating a word-line potential to be applied to the word lines of the sub-memory macros, wherein at least one of the sub-memory macros is combined with the control-section macro, forming a one-chip memory capable of storing an integral multiple of N bits.

According to another aspect of the present invention, there is provided a semiconductor device that includes a logic circuit section formed of either a gate array or standard cells, sub-memory macros having a memory-cell array capable of storing N bits, a selection circuit for selecting any of the memory cells of the memory-cell army, and test-mode switching means for switching, in accordance with a test control signal, normal operating mode in which data is written into and read from the memory cells of the memory-cell array, to test mode in which defective cells are detected, and a control-section macro having a test circuit for generating from an input signal the test control signal to determine an operating mode for the sub-memory macros, wherein at least one of the sub-memory macros is combined with the control-section macro, forming a one-chip memory capable of storing an integral multiple of N bits.

According to another aspect of the present invention, there is provided a semiconductor device that includes a logic circuit section formed of either a gate array or standard cells, sub-memory macros having word lines arranged in row direction, bit lines arranged in column direction, a memory-cell array capable of storing N bits and formed of N memory cells connected to the word lines and the bit lines, and a selection circuit for selecting any of the memory cells of the memory-cell array, and a control-section macro having DC potential generating means for generating various DC potentials required for driving the sub-memory macros, and word-line potential to be applied to the word lines of the sub-memory macros, wherein at least one of the sub-memory macros is combined with the control-section macro, forming a one-chip memory capable of storing an integral multiple of N bits.

BRIEF DESCRIPTION OF DRAWINGS

Other objects an advantages of the present invention will become apparent during the following discussion in conjunction with the accompanying drawings, in which.

DETAILED DESCRIPTION OF PREFERRED EMBODIMENTS

Figure 1:
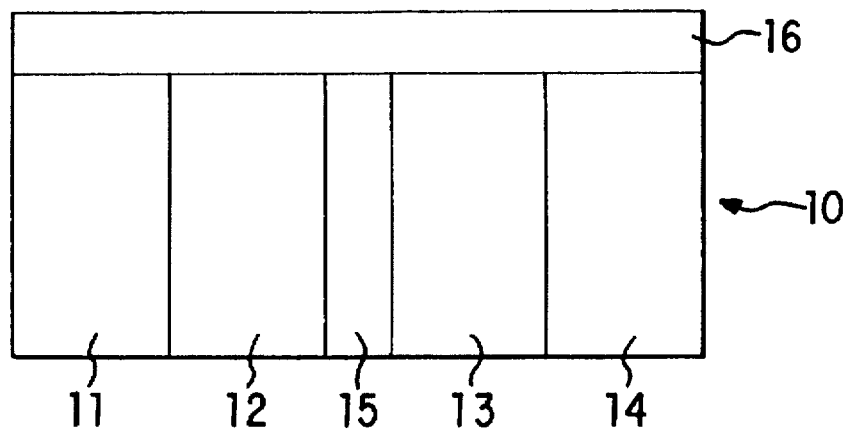
FIG. 1 is a block diagram showing a semiconductor memory device according to the first embodiment of the present invention.

FIG. 1 is a block diagram showing a semiconductor memory device which is a first embodiment of the present invention. The semiconductor memory device according to this embodiment includes a logic circuit and a semiconductor memory macro which are mounted together on the same semiconductor chip. The memory macro and some other parts provided near the memory macro are illustrated in FIG. 1. The memory macro 10 is constituted by first to fourth sub-memory macros 11 to 14 arranged in a row, each functioning as an independent memory. A control-section macro 15 is provided between the second sub-memory macro 12 and the third sub-memory macro 13.

The control-section macro 15 includes a DC potential generating circuit for generating various DC potentials required for driving the sub-memory macros, a word-line potential generating circuit for generating a word-line potential to be applied to the word lines of each sub-memory macro, a test circuit for generating from an input signal a test control signal to determine an operating mode for the sub-memory macros. The various potentials or the signals generated in the control-section macro 15 are supplied to the first to fourth sub-memory macros 11 to 14. Each of the sub-memory macros has a storage capacity of 2 megabits. Hence, the four sub-memory macros 11 to 14 have a total storage capacity of 8 megabits.

A wiring section 16 is provided adjacent to the first to fourth sub-memory macros 11 to 14 and the control-section macro 15. The wiring section 16 includes a plurality of wires (not shown), preferably formed of aluminum or polysilicon. It is through these wires that the potentials or signals generated in the control-section macro 15 and the various signals generated in the semiconductor chip are supplied to the first to fourth sub-memory macros 11 to 14. Through these wires, the signals generated in the semiconductor chip are supplied to the control-section macro 15.

As described above, the semiconductor memory device according to the first embodiment is a combination of four sub-memory macros and one control-section macro.

Figure 2:
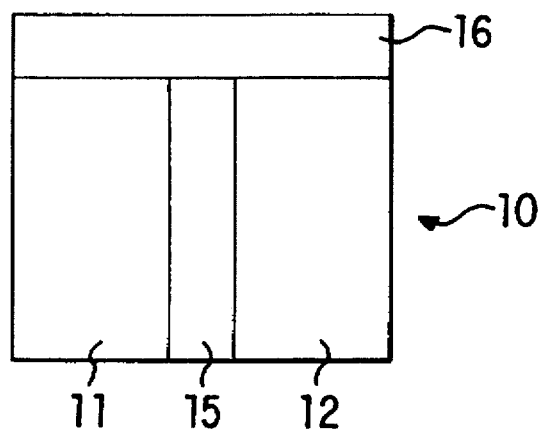
FIG. 2 is a block diagram illustrating a first modification of the first embodiment.

FIG. 2 is a block diagram illustrating a first modification of the first embodiment. The first modified semiconductor memory device includes two sub-memory macros, i.e., first and second sub-memory macros 11 and 12, and one control sectional macro 15. The first modified semiconductor memory device differs from the first embodiment in number of sub-memory macros, and has half the storage capacity of the first embodiment. The control-section macro 15 is provided between the first sub-memory macro 11 and the second sub-memory macro 12.

Figure 3:
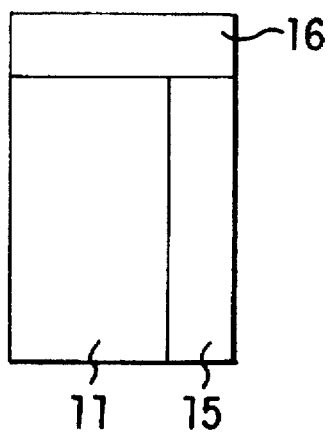
FIG. 3 is a block diagram depicting a second modification of the first embodiment.

FIG. 3 is a block diagram illustrating a second modification of the first embodiment. The second modified semiconductor memory device includes one sub-memory macro 11 and one control-section macro 15. The second modified semiconductor memory device differs from the first embodiment in number of sub-memory macros, and has half the storage capacity of the first modified device shown in FIG. 2. The control-section macro 15 is provided adjacent to the sub-memory macro 11.

The semiconductor memory device according to the first embodiment, including the first and second modifications, includes one to four sub-memory macro, depending on the desired storage capacity for the memory macro, a control-section macro, and a wiring section. Thus, the device can be designed within a short time, attaining advantages over conventional art, provided sub-memory macros and control-section macros are available in the form of libraries. In fact, it suffices to design the wiring section only. In addition, since the DC potential generating circuit and the word-line potential generating circuit, both requiring a large installation area on a semiconductor chip, are provided in the control-section macro only, not in each sub-memory macro, the memory macro does not occupy a relatively large area on the semiconductor chip, decreasing the chip cost.

Figure 4:
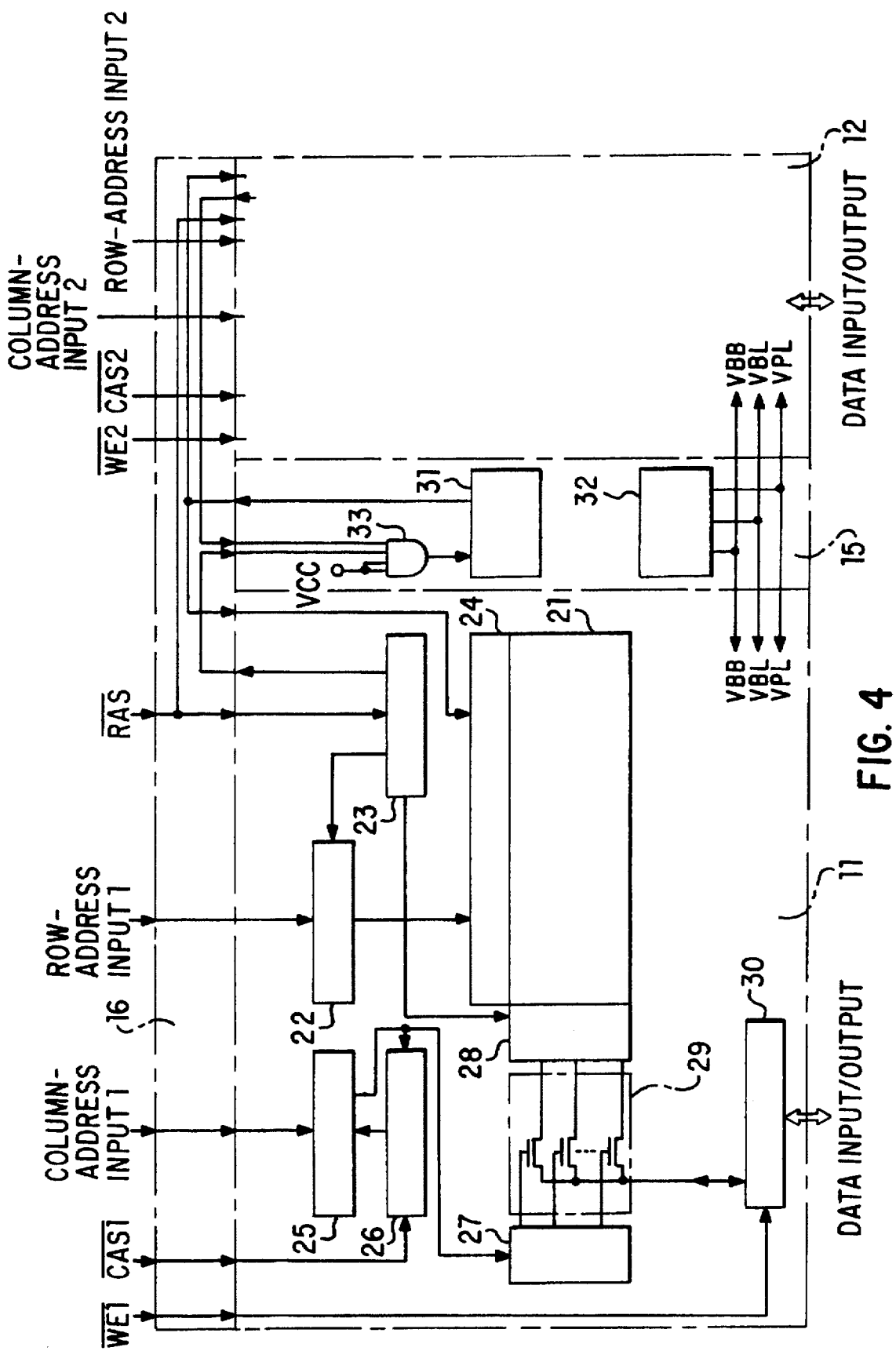
FIG. 4 is a circuit diagram showing in detail the semiconductor memory device according to the first embodiment.

The circuit configuration of the semiconductor memory device according to the first embodiment will be described below in detail. FIG. 4 is a detailed circuit diagram of the semiconductor memory device shown in FIG. 2, i.e., the first modified device which has two sub-memory macros. The sub-memory macros used in this device are of DRAM structure.

The first sub-memory macro 11 includes a DRAM memory-cell array 21 having a number of DRAM memory cells, a row-address buffer 22, a row-system control circuit 23, a row decoder 24, a column address buffer 25, a column-system control circuit 26, a column decoder 27, a sense amplifier circuit 28, circuit 29, and circuit 29, and a data input/output buffer 30.

In the DRAM memory-cell array 21 there are provided a plurality of word lines and a plurality of bit-line pairs. The DRAM memory cells are connected to the word lines and the bit-line pairs, at the intersections of the word lines and the bit-line pairs.

The row-address buffer 22 supplies internal row addresses to the row decoder 24 in accordance with the outputs of a row address input 1 and an output of the row-system control circuit 23.

The row-system control circuit 23 generates a timing control signal in response to a row-address strobe signal/RAS. The timing control signal is output to the row-address buffer 22, causing the buffer 22 to receive the row-address input 1.

The row decoder 24 selects and drives one of the word lines provided in the DRAM memory-cell array 21 in accordance with the output of the row address buffer 22.

The column-address buffer 25 generates an internal column address in response to the outputs of the column-address input 1 and the output of the column-system control circuit 26.

The column-system control circuit 26 generates a timing control signal in response to a column-address strobe signal/CAS1 and an output of the column-address buffer 25. The timing control signal is output to the column-address buffer 25, causing the buffer 25 to receive the column-address input 1.

In response to the output of the row-system control circuit 23, the sense amplifier circuit 28 amplifies the potential which has been read from the DRAM memory cells connected to the word line driven by the row decoder 24 and which has been applied to the bit-line pairs. The circuit 28 therefore effects the sensing of data. The sense amplifier circuit 28 has a bit-line equalizing circuit which is designed to initialize and equalize the potentials of the bit-line pairs.

The column-gate 29 has a plurality of N-channel MOS transistors, each having the source-drain path connected between the sense amplifier circuit 28 and the data input/output buffer 30 as illustrated in FIG. 4. The gates of these MOS transistors are connected to the decode outputs of the column decoder circuit 27, respectively.

Upon receipt of a write-enable signal/WE1, the data input/output buffer 30 receives data to be written and supplies this data to the sense amplifier circuit 28 through the column-gate circuit 29, or receives the data to read which the sense amplifier 28 has amplified and is supplied the data through the column-gate circuit 29.

The first sub-memory macro 11 has no components which are equivalent to either the word-line boosting circuit 31 or the DC potential generating circuit 32.

The second sub-memory macro 12 is similar to the first sub-memory macro 11 in terms of internal structure. It differs-in that a row-address input 2, a column-address input 2, a column-address strobe signal/CAS2, a write-enable signal/WE2 are input, instead of the row-address input 1, the column-address strobe signal/CAS 1 and the write-enable signal WE1.

The control-section macro 15 includes a word-line boosting circuit 31, a DC potential generating circuit 32, and an AND gate circuit 33.

The DC potential generating circuit 32 is a particular component for use in a DRAM. It generates, for example, three kinds of DC potentials VBB, VBL and VPL. The DC potential VBB is a bias potential which is to be applied to the P-well region of the semiconductor substrate to set the N-channel MOS transistor provided in the P-well region at a predetermined threshold voltage. The DC potential VBL is a potential for charging the bit lines.

The DC potential VPL is a potential to be applied to the plate electrodes of the capacitors included in the DRAM memory cells. These DC potentials are applied to the first and second sub-memory macros 11 and 12.

The word-line boosting circuit 31 is designed to generate a high potential which is applied to the word lines driven by the row decoder 24. The word-line boosting circuit 31 boosts the power-supply potential VCC, thereby generating the high potential, under the control of the output of the AND gate circuit 33. Two of the four inputs of the AND circuits 33 are connected to the outputs of the row-system control circuits 23 provided in the first and second sub-memory macros 11 and 12. The remaining two inputs of the AND circuit 33 are fixed at the power-supply potential VCC.

The wiring section 16 has wires. Some of the wires are used to supply various input signals, e.g., the row-address inputs 1 and 2 and the column-address inputs 1 and 2. Some other wires are used to supply various signals, e.g., the signals output from the row-system control circuits 23, from the first sub-memory macro 11 to the second sub-memory macro 12 and vice versa.

To access the memory cells of the DRAM memory cell array 21 included in the first and second sub-memory macros 11 and 12, a row-address strobe signal/RAS is input. In response to the signal/RAS, the row-system control circuits 23 provided in the first and second sub-memory macros 11 and 12 output signals. These signals are input via the wires of the wiring section 16 to the AND gate circuit 33 included in the control-section macro 15. Then the word-line boosting circuit 31 starts boosting the power-supply potential VCC. The boosted potential is applied to the row decoders 24 included in the first and second sub-memory macros 11 and 12. The boosted potential is applied as a drive signal to the word line selected in accordance with the internal row-address output from the row-address buffer 22.

The AND gate circuit 33 has four input terminals. Therefore, the semiconductor memory device can work well if it has four sub-memory macros as is illustrated in FIG. 1.

Namely, if it has three sub-macros, three of the four inputs of the AND circuit 33 are connected to the outputs of the row-system control circuits 23 provided in the first, second and third sub-memory macros. The remaining one input of the AND circuit 33 is fixed at the power-supply potential VCC. If it has four sub-macros, each of the four inputs of the AND circuit 33 is connected to the outputs of the row-system control circuit 23 provided in the first, second, third and fourth sub-memory macros. Then, no input of the AND circuit 33 is fixed at the power-supply potential VCC.

The DC potential generating circuit 32 generates three kinds of DC potentials VBB, VBL and VPL defined above. The DC potentials are applied to the designated circuits provided in the first and second sub-memory macros 11 and 12. It is through the wires connecting the control-section macro to the sub-memory macros that these DC potentials are applied to the sub-memory macros. Alternatively, the wiring section 16 may contain wires for applying the DC potentials to the sub-memory macros.

Figure 5:
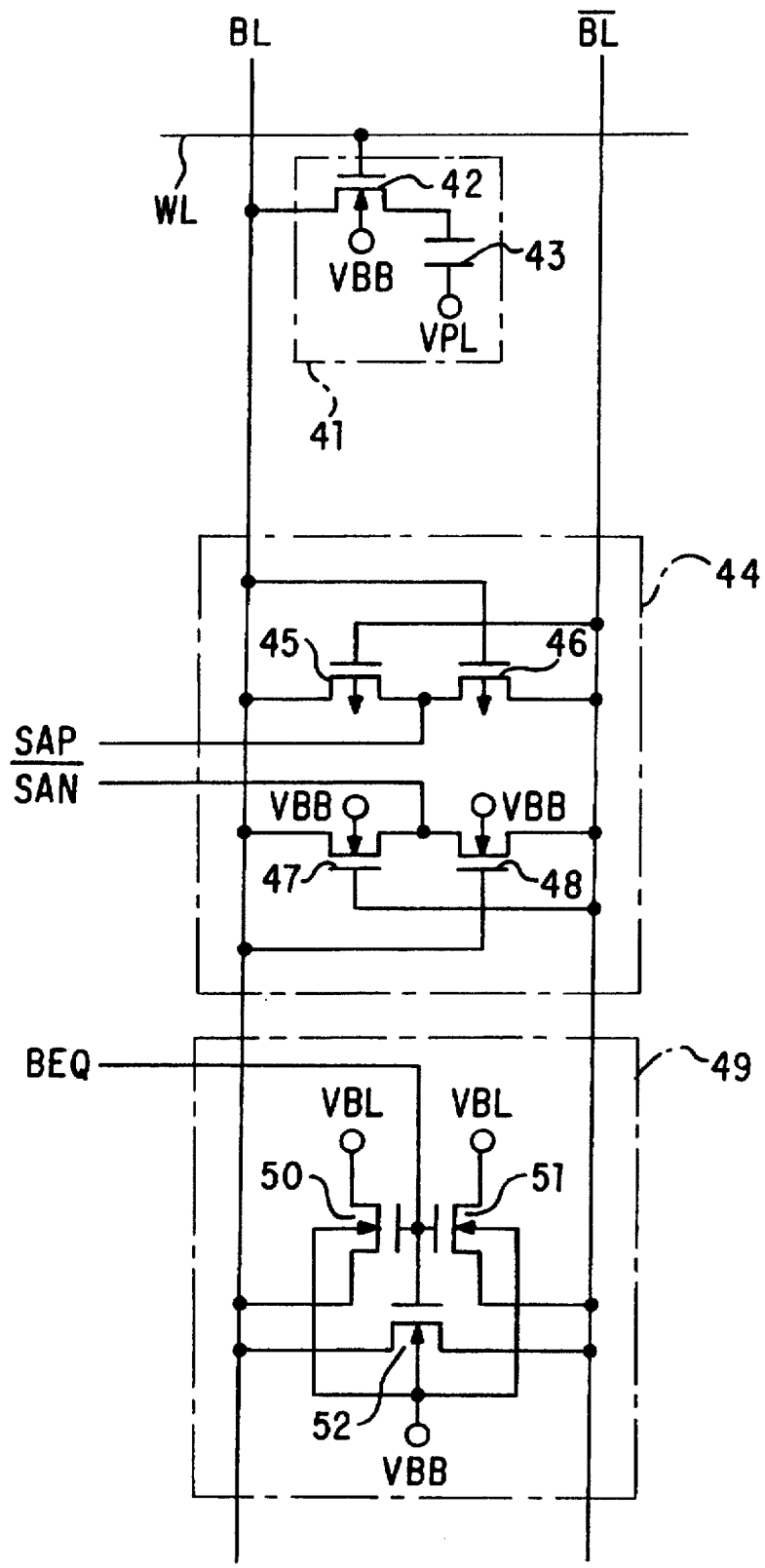
FIG. 5 is a circuit diagram illustrating one of the bit-line pairs provided in the DRAM memory-cell array 21 shown in FIG. 4, and some components arranged near the bit-line pair.

FIG. 5 shows one of the bit-line pairs incorporated in the DRAM memory-cell array 21 and some components connected to the bit-line pair. A DRAM memory cell 41 is located at the intersection of a word line WL and the bit-line pair consisting of bit lines BL and/BL. The DRAM memory cell 41 includes an N-channel MOS transistor 42 and a data-storing capacitor 43. The transistor 42 has its drain connected to one of the bit lines, e.g., the bit line BL and its gate connected to the word line WL. The capacitor 43 is connected to a memory node, i.e., the source of the MOS transistor 42.

The DC potential VBB generated in the DC potential generating circuit 32 is applied to the back gate of the MOS transistor, i.e., the P-well region in which the MOS transistor is provided. The DC potential VPL generated in the DC potential generating circuit 32 is applied to the node of the capacitor 43, which faces away from the memory node and which is called "capacitor plate electrode."

One of the sense amplifiers 44 provided in the sense amplifier circuit 28 is connected to the bit-line pair.

The sense amplifier 44 includes two P-channel MOS transistors 45 and 46 and two N-channel MOS transistors 47 and 48. The transistors 45 and 46 are controlled by a P-channel sense control signal SAP, whereas the transistors 47 and 48 are controlled by an N-channel sense control signal/SAN. The DC potential VBB is applied to the back gates of the N-channel MOS transistors 47 and 48, i.e., the P-well region in which these MOS transistors are provided.

The bit-line equalizing circuit 49 is designed to, as described above, initialize and equalize the potentials of the bit-line pair. The circuit 49 includes three MOS transistors, i.e., an N-channel MOS transistor 50, and N-channel MOS transistor 51 and an N-channel MOS transistors 52. The transistor 50 is connected between one of the bit lines, i.e., the bit line BL, and a node to which the DC potential VBL is applied from the DC potential generating circuit 32.

The transistor 51 is connected to the node and the other bit line /BL. The transistor 52 is connected between the bit lines BL and /BL. An equalize control signal BEQ is supplied to the gates of these MOS transistors. The DC potential VBB is applied to the back gates (i.e., the P-well) of the MOS transistors.

To access the DRAM memory cells 41, the equalize control signal BEQ is activated. The three MOS transistors 50 to 52 included in the bit-line equalizing circuit 49 are thereby turned on. While the transistors remain on, the bit lines are charged with the potential VBL and set at the same potential. The boosted high potential is then applied to the word line WL, selecting the DRAM memory cell 41. The memory node of the capacitor 43 provided in the DRAM memory cell 41 is thereby connected to the bit line BL. To read data from the cell 41, the charge accumulated in the capacitor 43 is supplied to the bit line BL. Thereafter, the P-channel sense control signal SAP and the N-channel sense control signal/SAN are activated, whereby the sense amplifier 44 amplifies the potential difference between the bit lines BL and/BL. Thus, data-sensing is achieved. To write data into the cell 41, the data is supplied to the bit-line pair. Then, in the DRAM memory cell 41, the electric charge corresponding to the data is supplied via the MOS transistor 42 to the memory node of the capacitor 43 and accumulated in the memory node.

Figure 6:
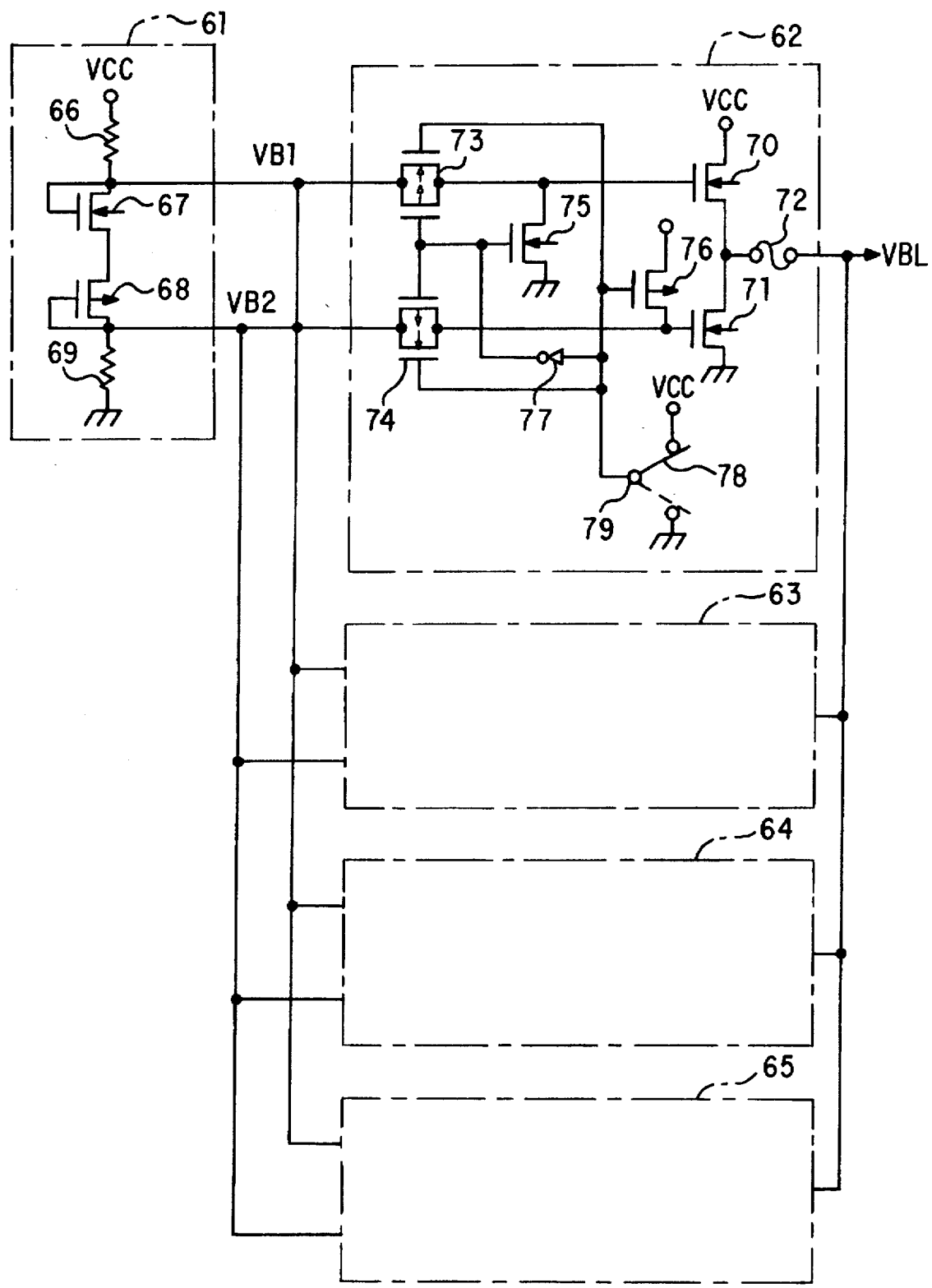
FIG. 6 is a circuit diagram showing in detail a part of the DC potential generating circuit incorporated in the semiconductor memory device according to the first embodiment.

The DC potential generating circuit 32 provided in the control-section macro 15 generates three DC potentials as described above. FIG. 6 shows in detail that part of the circuit 32 which generates the DC potential VBL. The DC potential VBL needs to be set as half the power-supply potential VCC as in DRAMs. To set the potential VBL at ½ VCC, the DC potential generating circuit shown in FIG. 6 includes a bias potential generating section 61 and four drive sections 62 to 65. The circuit 61 is designed to generate two bias potentials VB1 and VB2. Each of the drive sections 62 to 65 receives the bias potentials VB1 and VB2 and increases the current-driving ability of either bias potential.

The bias potential generating section 61 includes a resistor 66, an N-channel MOS transistor 67, a P-channel MOS transistor 68 and a resistor 69, which are connected in series in the order between the power-supply potential VCC and the ground potential. The DC bias potential VB1 is generated at the node of the resistor 66 and the MOS transistor 67, and the DC bias potential VB2 at the node of the MOS transistor 68 and the resistor 69.

The first to fourth drive sections 62 to 65 have the same structure. Only the first drive section 62 will be described. As shown in the figure, the section 62 includes a N-channel MOS transistor 70, a P-channel MOS transistor 71, a fuse element 72, a CMOS transfer gate 73, a CMOS transfer gate 74, an N-channel MOS transistor 75, a P-channel MOS transistor 76 and an inverter 77. The transistors 70 and 71 are provided on the output side. The fuse element 72 is connected between the common source of the MOS transistors 70 and 71 and the output node for a potential VBL. The transfer gate 73 is used to apply the bias potential VB1 to the gate of the MOS transistor 70. The transfer gate 74 is used to apply the bias potential VB2 to the gate of the MOS transistor 71.

An aluminum option switch 78 is provided for connecting a node 79 to the power-supply potential or the ground potential in the manufacturing step of forming aluminum wires. When the node 79 of the aluminum option switch is connected to the power-supply potential, both CMOS transfer gates 73 and 74 are conducting, whereby the bias potentials VB1 and VB2 are applied to the gate of the N-channel MOS transistor 70 and the gate of the P-channel MOS transistor 71, respectively. As a result, a potential of ½ VCC is obtained at the common source of the MOS transistors 70 and 71. The potential is applied through the fuse element 72.

When the node 79 of the aluminum option switch is connected to the ground potential, both CMOS transfer gates 73 and 74 are non-conducting. In this case, the bias potential VB1 is not applied to the gate of the N-channel MOS transistor 70, nor is the bias potential VB2 is applied to the gate of the P-channel MOS transistor 71. As a result, the output is floating. In this condition, the N-channel MOS transistor 75 and the P-channel MOS transistor 76 are conducting, and the MOS transistors 70 and 71 on the output side are fixed at the ground potential and the power-supply potential, respectively. Hence, both transistors 70 and 71 are reliably remain in non-conducting state.

The VBL-generating circuit which has the structure described above can adjust the driving ability of the potential VBL in accordance with the number of sub-memory macros used, by operating the aluminum option switch 78 and using the fuse elements 72 to activate the selected ones of the first to fourth drive sections 62 to 65. In order to use only one sub-memory macro is used, the fuse elements 72 included in the second to fourth drive sections 63 to 65 are cut, and the nodes 79 of the aluminum option switches 78 provided in the second to fourth drive sections 63 to 65 are connected to the ground potential. Only the first drive section 62 is thereby activated, while the second to fourth drive sections 63 to 65 are rendered inactive. In the drive sections 63 to 65 which are now inactive, a direct current is prevented from flowing between the power-supply and the ground.

In order to use all four sub-memory macros, the fuse elements 72 included in the first to fourth drive sections 62 to 65 are not cut, and the nodes 79 of the aluminum option switches 78 provided are connected to the power-supply potential. The first to fourth drive sections 62 to 65 are thereby activated, and a DC potential VBL having a sufficient current-driving ability is obtained.

Thus, the potential-generating circuit shown in FIG. 6 can generate a DC potential VBL having an optimal current-driving ability, merely by operating the aluminum option switches and using one, some or all fuse elements.

If the DC potential VBL need not be adjusted in terms of its current-driving ability, the potential-generating circuit may be modified in one of two alternative ways. In the first alternative way, the bias potential generating section 61 is connected to only one drive section, which has only two output MOS transistors equivalent to the MOS transistors 70 and 71 and which has no components equivalent to the CMOS transfer gates 73 and 74, the MOS transistors 75 and 76, the inverter 77, the aluminum option switch 78 and the fuse element 72. In the second alternative way, the bias potential generating section 61 is connected to four drive sections, each of which has no components equivalent to the CMOS transfer gates 73 and 74, the MOS transistors 75 and 76, the inverter 77, the aluminum option switch 78 and the fuse element 72. The outputs of four drive sections are connected in parallel. The output MOS transistors (70 and 71) used in the first modification have a sufficient current-driving ability and, hence, a large element area. By contrast, the output MOS transistors (70 and 71) of each drive section provided in the second modification have a relatively small current-driving ability and, hence, a comparatively small element area.

Figure 7:
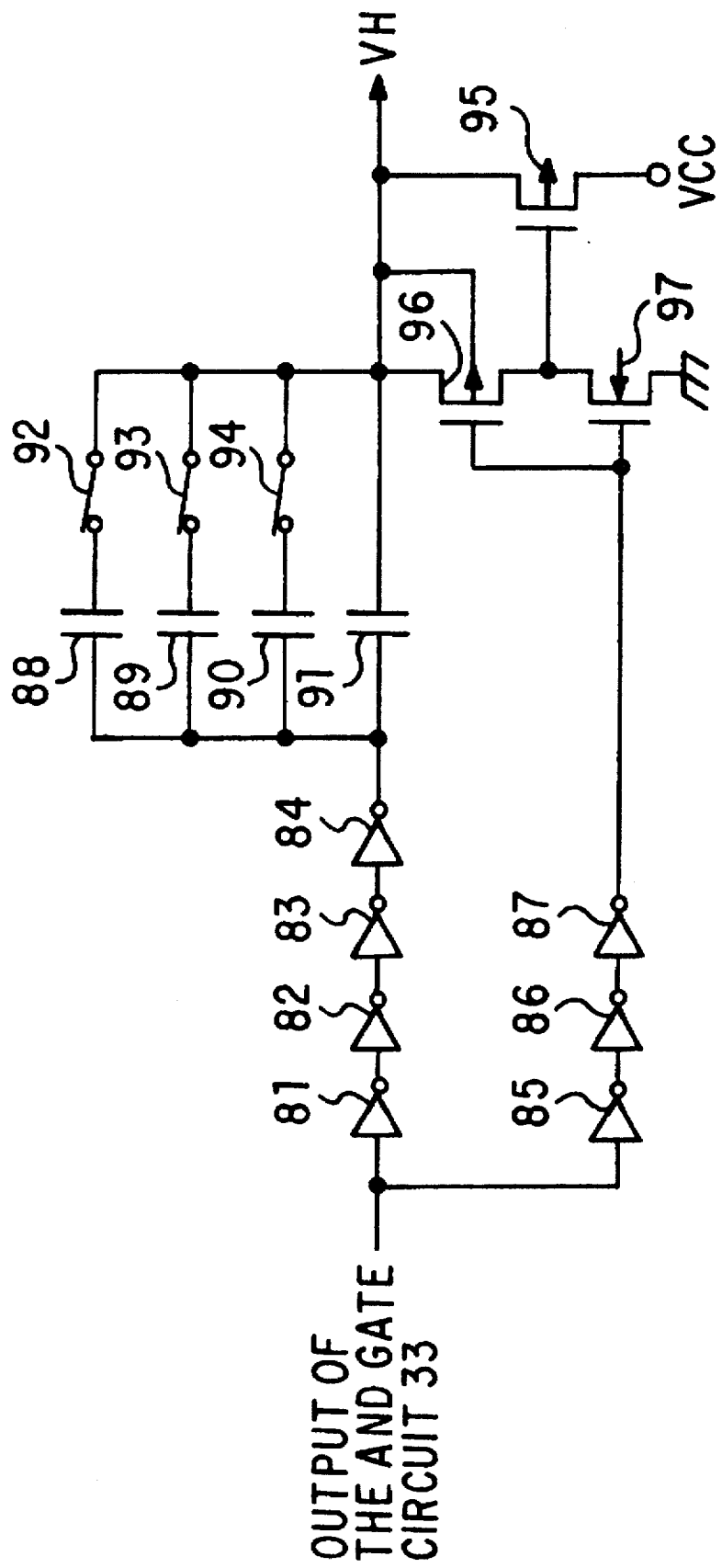
FIG. 7 is a circuit diagram illustrating in detail the word-line boosting circuit provided in the semiconductor memory device according to the first embodiment.

FIG. 7 shows in detail the word-line boosting circuit 31 incorporated in the control-section macro 15. This circuit is of bootstrap type which has capacitors. It includes four inverters 81 to 84 connected in series, three other inverters 85 to 87 connected in series, four capacitors 88 to 91, three switches 92 to 94, two P-channel MOS transistor 95 and 96, and one N-channel MOS transistor 97. The word-line boosting circuit 31 is supplied with the output of the AND gate circuit 33 (FIG. 4) and increases the power-supply potential VCC, thereby generating a high voltage VH.

The high voltage VH is applied to the row decoder 34. This high voltage VH is about as one and a half times as the voltage VCC.

How the circuit of FIG. 7 operates will be explained below. When the output of the AND gate circuit 33 is at low level, the output of the inverter 87, i.e., the last stage of the series circuit of the inverters 85 to 87, is set at high level. Receiving the output of the inverter 87 at its gate, the N-channel MOS transistor 97 becomes conducting, setting the gate of the P-channel MOS transistor 95 at the ground potential. The MOS transistor 95 is turned on, setting the node of the potential VH at the power-supply potential VCC.

When the output of the AND gate circuit 33 rises from the low level to the high level, the output of the inverter 84, i.e., the last-stage of the series circuit including the four inverters 81 to 84, rises to the high level. At this time, the node of the potential VH is set at a potential higher than VCC, due to the coupling achieved by the capacitor 88 to 91.

In the embodiment, the ability of supplying a charge at the potential VH can be varied by operating the three switches 92 to 94. In other words, when the switches 92 to 94 are operated, the ability of supplying a charge at the potential VH can be adjusted in accordance with the number of sub-memory macros used. For example, all switches 92 to 94 are opened when only one sub-memory macro is used. In this case, an electric charge is supplied to the node of potential VH through the capacitor 91 only.

When four sub-memory macros are used, all switches 92 to 94 are closed. In this case, charges are supplied to the node of potential VH through the four capacitors 88 to 91, whereby the charge-supplying ability is optimized easily.

With the word-line boosting circuit 31 shown in FIG. 7, it is easy to optimize the ability to apply a charge at the high potential VH in accordance with the number of sub-memory macros used.

Figure 8:
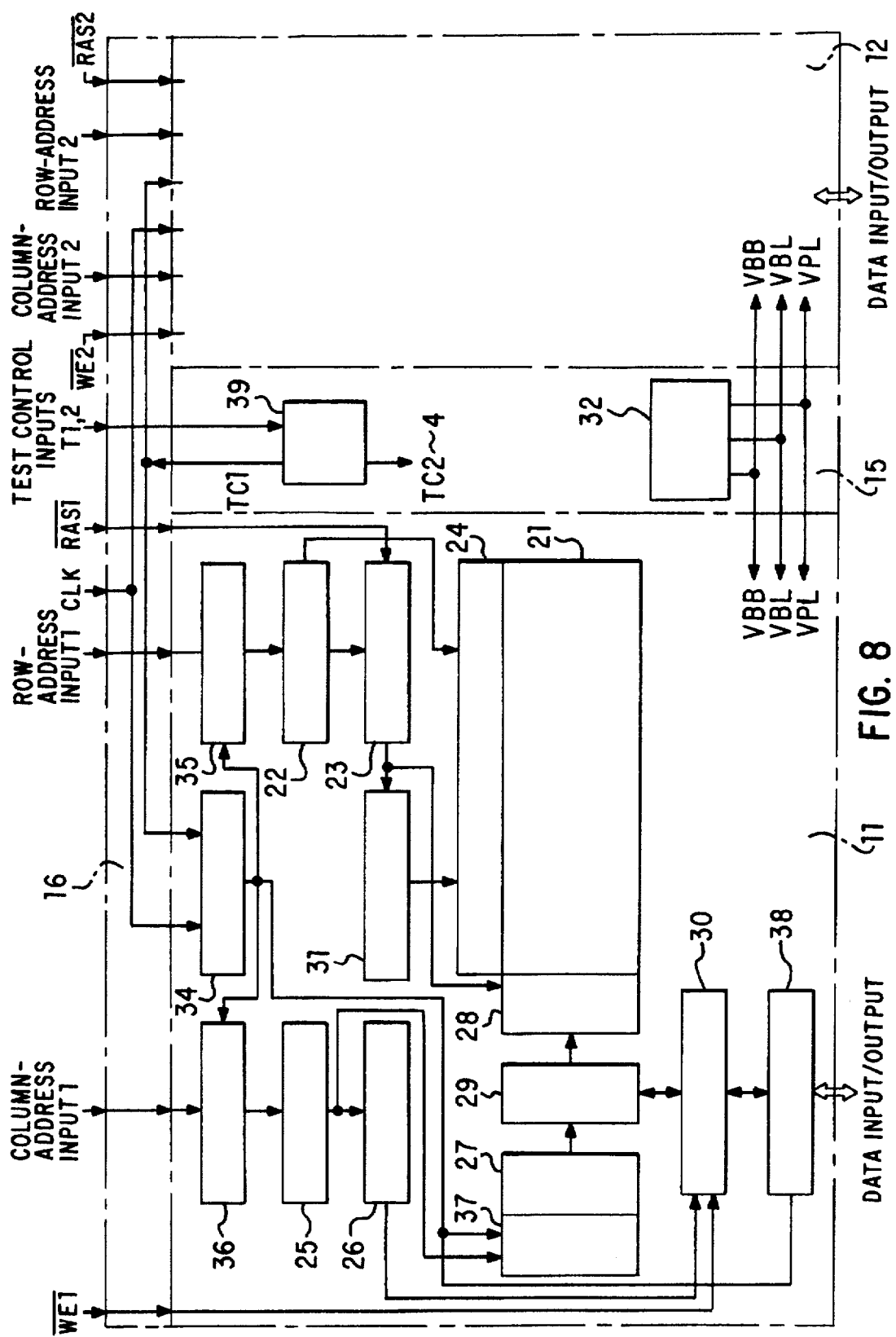
FIG. 8 is a circuit diagram depicting in detail a semiconductor memory device according to the first modification of the first embodiment.

FIG. 8 shows in detail a semiconductor memory device according to the first modified device shown in FIG. 2, which differs from the device illustrated in FIG. 4. The sub-memory incorporated in this device are of a clock-synchronized DRAM structure.

Like its counterpart shown in FIG. 4, the first sub-memory macro 11 includes a DRAM memory-cell array 21, a row-address buffer 22, a row-system control circuit 23, a row decoder 24, a column-address buffer 25, a column-system control circuit 26, a column decoder 27, a sense amplifier circuit 28, a column-gate circuit 29, and a data input/output buffer 30. In the present embodiment, a word-line boosting circuit 31 is included in the first sub-memory macro 11, not in the control-section macro 15 as in the device shown in FIG. 4. The first sub-memory macro 11 further includes a clock buffer 34 and four flip-flops 35 to 38. The data input/output buffer 30 is controlled by a write-enable signal/WE1 and an output of the column-system control circuit 26.

Of the four flip-flops mentioned above, the flip-flops 35, 36 and 37 are connected to the input of the row-address buffer 22, the input of the column-address buffer 25, and the input of the column decoder 27, respectively. The flip-flop 38 is connected to the output of the data input/output buffer 30. The flip-flops 35, 36 and 37 temporarily hold a row-address input 1, a column-address input 1 and an output of the column-address buffer 25, respectively, and supply these outputs to the row-address buffer 22, the column-address buffer 25 and the column decoder 27, respectively, in response to the clock signals. In order to read data from the memory device, the flip-flop 38 temporarily holds the data supplied from the data input/output buffer 30 and supplies it to the outside of the sub-memory macro, in response to the clock signal. In order to write data into the memory device, the flip-flop 38 temporarily holds the data and supplies it to the data input/output buffer 30 in response to the clock signal.

Upon receipt of a clock signal CLK, the clock buffer 34 generates an internal clock signal, which will control the four flip-flops 35 to 38.

The first sub-memory macro 11 has no component that corresponds to the DC potential generating circuit 32.

The second sub-memory macro 12 is identical in structure to the first sub-memory macro 11.

The control-section macro 15 includes a DC potential generating circuit 32 and a test circuit 39.

The DC potential generating circuit 32 generates three kinds of DC potentials VBB, VBL and VPL defined above. The test circuit 39 is used to test the memory function of the first and second sub-memory macros 11 and 12. In accordance with the test control inputs T1 and T2, the test circuit 39 activates one of test signals TC1 to TC4. Of the four test signals, the signal TC1 is supplied to the clock buffers 34 provided in the first and second sub-memory macros 11 and 12 through the wires included in a wiring section 16.

In the memory device of the structure described above, the clock signal CLK is used to write and read data in ordinary manner.

Figure 9:
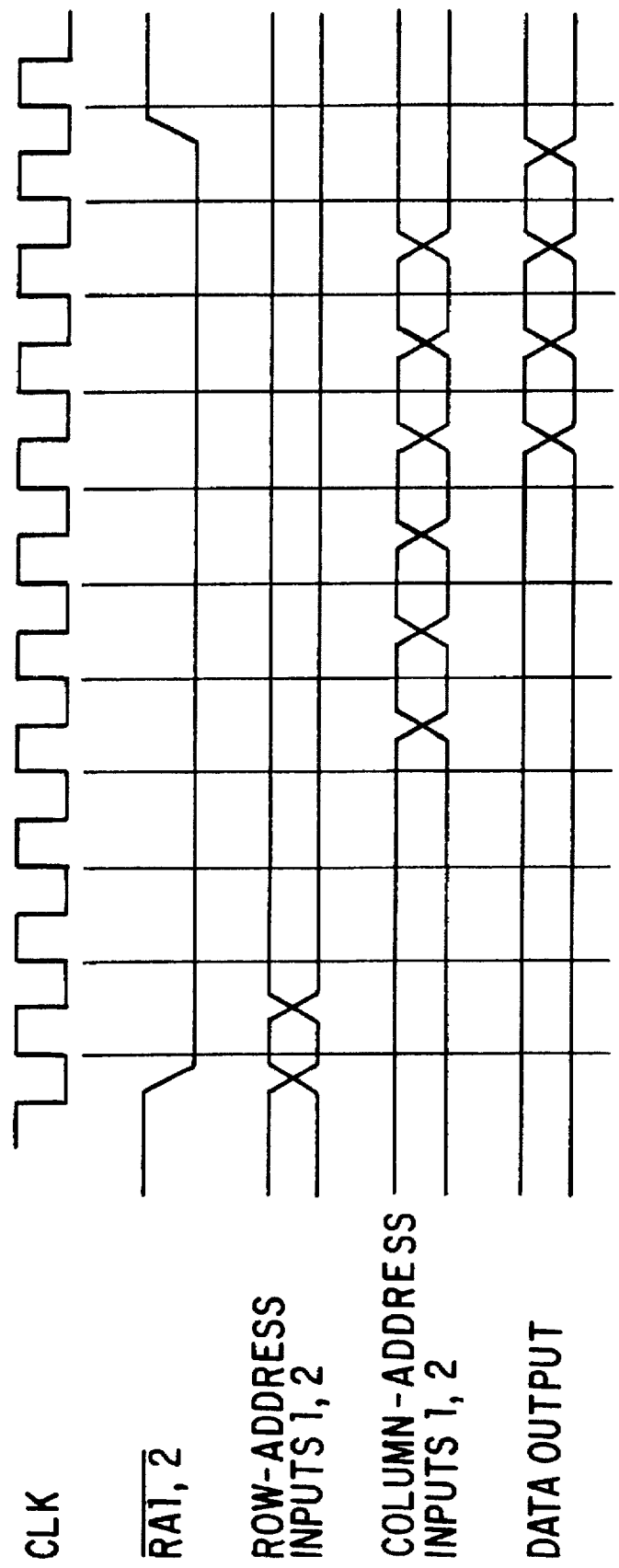
FIG. 9 is a waveform diagram showing the signals used to read data from the semiconductor memory device shown in FIG. 8.

FIG. 9 illustrates the waveforms of various signals applied in order to read data from the memory device. Assume that row-address strobe signal/RAS1 and/RAS2, row-address inputs 1 and 2 and column-address inputs 1 and 2 are input to the memory device, along with the clock signal CLK. Then, the data corresponding to the column addresses is determined in synchronism with the clock signal, after the column addresses have been established. In the first and second sub-memory macros 11 and 12, signals are supplied in pipeline scheme until the data is output from the memory device.

The flip-flops 35, 36 and 37 shown in FIG. 8 define three pipeline stages. Each signal is supplied from one pipeline stage to the next pipeline during each cycle period, in synchronism with the clock signal. Thus, in the clock-synchronized DRAM, data can be transferred at high speed in synchronism with a high-frequency clock signal of 50 MHz or more.

A problem arises with the sub-memory macros 11 and 12 of clock-synchronized type when they are tested for their memory function. Namely, the flip-flop for each pipeline stage blocks the passage of externally input signals, making it difficult to accomplish trouble analysis.

To solve this problem, a test mode is provided for the sub-memory macros 11 and 12 shown in FIG. 8. In the test mode, the flip-flops 36, 37 and 38 are set in a through state. To switch the operating mode and the test mode, test-control inputs T1 and T2 are supplied to the test circuit 39 provided in the control-section macro 15. The test circuit 39 decodes the test-control inputs, generating a test signal TC1 for controlling the clock buffers 34 provided in the sub-memory macros 11 and 12. The test circuit 39 and the clock buffer 34 will be described in detail, with reference to FIG. 10 and FIG. 11, respectively.

Figure 10:
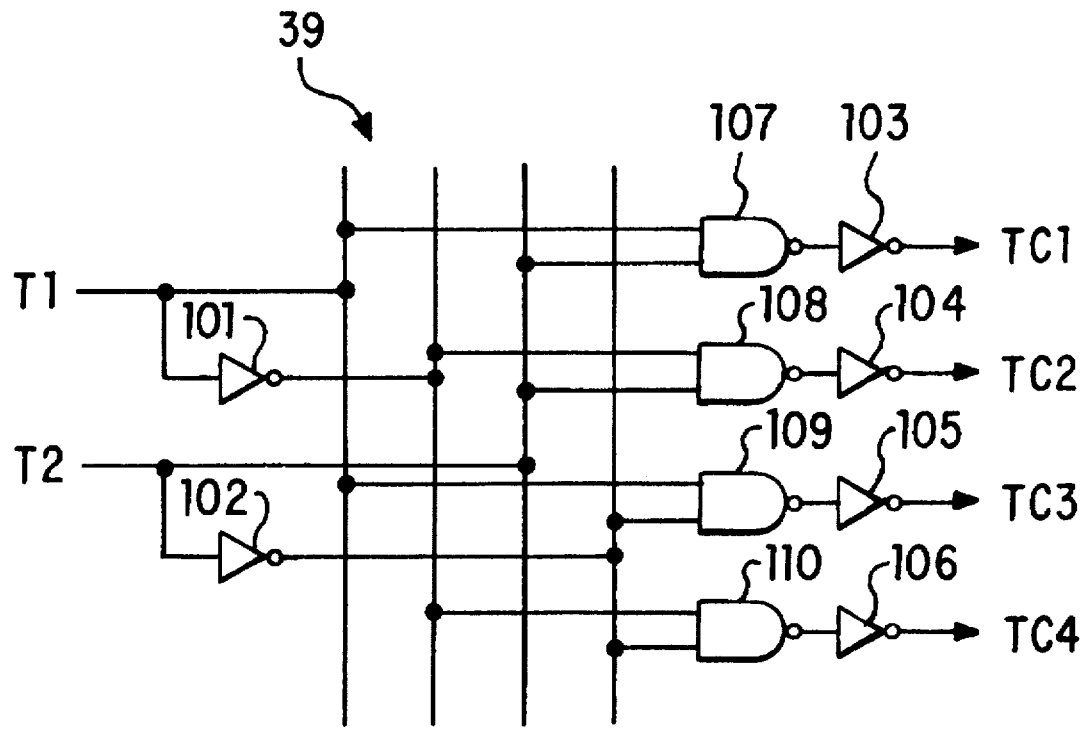
FIG. 10 is a circuit diagram showing in detail the test circuit incorporated in the semiconductor memory device shown in FIG. 8.

As shown in FIG. 10, the test circuit 39 includes six inverters 101 to 106 and four NAND gate circuits 107 to 110 provided for decoding signals. The inverters 101 and 102 invert the test-control inputs T1 and T2, respectively, producing signals/T1 and /T2. The test-control inputs T1 and T2 are supplied to the NAND gate circuit 107. The signal/T1 and the test-control input gate circuit 108. The test to the NAND gate circuit 108. The test-control input T1 and the signal/T2 are supplied to the NAND gate circuit 109. The signals/T1 and /T2 are supplied to the NAND gate circuit 110. The inverters 103 to 106 invert the outputs from the NAND gate circuits 107 to 110, generating test signals TC1 to TC4.

When both test control inputs T1 and 72 are set at high level, the output of the NAND gate 107 falls to the low level, and the output of the inverter 103 rises to the high level. The test signal TC1 is thereby activated. The remaining test signals TC1 to TC4 will be used in other test modes.

Figure 11:
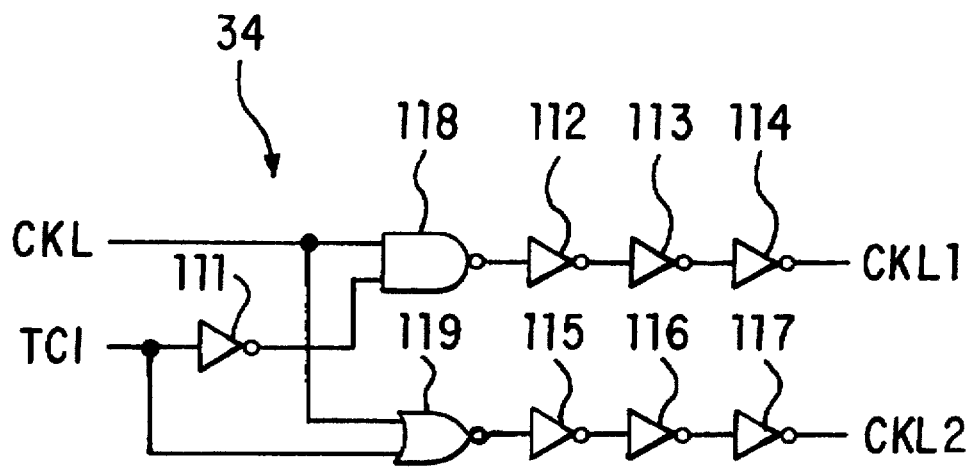
FIG. 11 is a circuit diagram showing the clock buffer provided in the semiconductor memory device illustrated in FIG. 8.

As depicted in FIG. 11, the clock buffer includes seven inverters 111 to 117, a NAND gate circuit 118, and a NOR gate circuit 119. The inverter 111 inverts the test signal TC1 generated by the test circuit 39 shown in FIG. 10. To the AND gate circuit 118, there are supplied the clock signal CLK and an output from the inverter 111. The clock signal CLK is also supplied to the NOR gate circuit 119, along with the test signal TC1.

Of the seven inverters, the inverters 112, 113, and 114 are connected in series. The inverter 112, which is the first-stage of the series circuit, receives an output of the NAND gate circuit 118. The inverter 114, which is the last-stage of the series circuit, outputs a first internal clock signal CLK1. Of the seven inverters, the inverters 115, 116 and 117 are connected in series. The inverter 115, which is the first-stage of the series circuit, receives an output of the NOR gate circuit 119. The inverter 117, which is the last-stage of the series circuit, outputs a second internal clock signal CLK2. The first and second clock signal CLK1 and CLK2 the clock buffer 34 has produced are supplied as clock signals to each of the flip-flops 35 to 38.

In the clock buffer shown in FIG. 11, while the test signal TC1 remains at the low level, that is, while the memory device stays in the operating mode, the NAND gate circuit 118 and the NOR gate circuit 119 Operated as inverters, inverting the input clock signal CLK. The first and second internal clock signals CLK1 and CLK2 the clock buffer outputs are therefore in the same phase as the input clock signal CLK. Each of the flip-flops 35 to 38 used in the first and second sub-memory macros 11 and 12, to which both internal clock signals CLK1 and CLK2 are supplied, functions as a master-slave flip-flop, transferring the input signal to the next-state component, in synchronism with the clock signals.

The test signal TC1 is set at the high level in the test mode. The output of the NAND gate circuit 118 is set at the high level, regardless of the level of the input clock signal CLK. The first and second internal clock signals CLK1 and CLK2 are fixed at the low level and the high level, respectively. At this time, the flip-flops 35 to 38, to which the first and second internal clock signals CLK1 and CLK2 are supplied, are set into through state and allow the passage of the input signals.

Figure 12A:
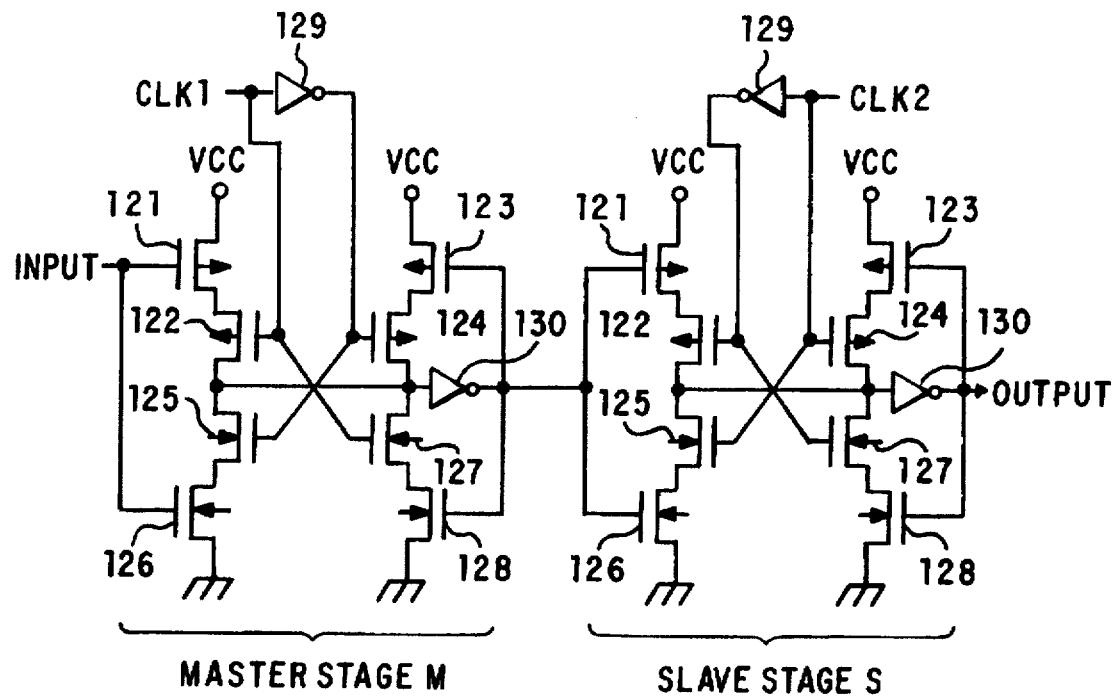
FIG. 12(A) is a circuit diagram depicting one of the flip-flops incorporated in the semiconductor memory device shown in FIG. 8.

Shown in FIG. 12(a) is a detailed circuit diagram of one of the flip-flops 35 to 38. The flip-flop is a master-slave type flip-flop and includes a master stage M and a slave stage S. The master stage M and the slave stage S are of the same structure, each including four P-channel MOS transistors 121 to 124, four N-channel MOS transistors 125 to 128, and two inverters 129 and 130.

The P-channel MOS transistors 121 and 122 and the N-channel MOS transistors 125 and 126 are connected in series between the power-supply potential and the ground potential. Similarly, the P-channel MOS transistors 123 and 124 and the N-channel MOS transistors 127 and 128 are connected in series between the power-supply potential and the ground potential. The P-channel MOS transistor 121 and the N-channel MOS transistor 126 have their gates connected together. The P-channel MOS transistor 122 and the N-channel MOS transistor 127 have their gates connected together. The P-channel MOS transistor 124 and the N-channel MOS transistor 125 have their gates connected together. Further, the P-channel MOS transistor 123 and the N-channel MOS transistor 128 have their gates connected together. The node of the MOS transistors 122 and 125 and the node of the MOS transistors 124 and 127 are connected to each other and connected to the input of an inverter 130. The output of the inverter 130 is connected to the node of the MOS transistors 123 and 128.

In the matter stage M, an input signal is supplied to the gate node of the MOS transistors 121 and 126. A signal is supplied from the output of the inverter 130 to the slave stage S. The first internal clock signal CLK 1 generated by the clock buffer 34 (FIG. 11) is supplied to the gate node of the MOS transistors 122 and 127. The first internal clock signal CLK 1 is also supplied to the gate node of the MOS transistors 125 and 124 through the inverter 129. In the slave stage S, a signal output from the master stage M is supplied to the gate node of the MOS transistors 121 and 126. The second internal clock signal CLK2 generated by the clock buffer 34 (FIG. 11) is supplied to the gate node of the MOS transistors 124 and 125. The second internal clock signal CLK 2 is also supplied to the gate node of the MOS transistors 122 and 127 through the inverter 129.

In both the master stage M and the slave stage S, two P-channel MOS 121 and 122 and two N-channel MOS transistors 125 and 126 functions as a clocked inverter, and two P-channel MOS transistors 123 and 124 and two N-channel MOS transistors 127 and 128 function as a clocked inverter. Each clocked inverter operates in synchronism with either the first internal clock signal CLK1 or the second internal clock signal CLK2.

Figure 12B:
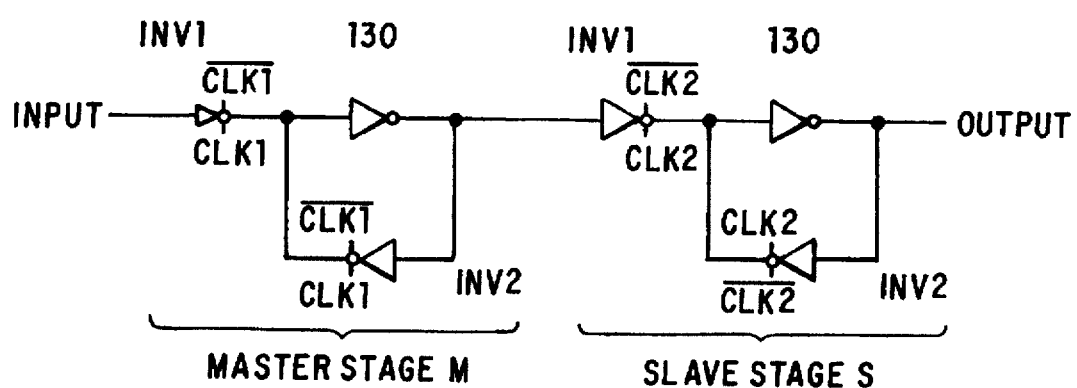
FIG. 12(B) is an equivalent circuit diagram of the flip-flop illustrated at FIG. 12(A)

Shown in FIG. 12(b) is an equivalent circuit diagram of the flip-flop illustrated in FIG. 12(a). In FIG. 12(b), the clocked inverters are designated at INV1 and INV2.

In the flip-flop thus structured, the docked inverters INV1 and INV2 in the master stage M and the slave stage S invert an input signal in synchronism with the clock signal CLK1 or CLK2, latching the input. Thus, the inverters INV1 and INV2 cooperate to operate as a flip-flop.

In the test mode, the clocked inverter INV1 is operative and the clocked inverter INV2 in inoperative in the master stage M and the slave stage S. This is because the first and second clocked signals CLK1 and CLK2 are fixed at the low level and the high level, respectively, in the test mode. Therefore, the circuit shown in FIG. 12(b) includes four inverters which are connected in series, and assumes a through state in which an input signal is output without being processed.

Figure 13:
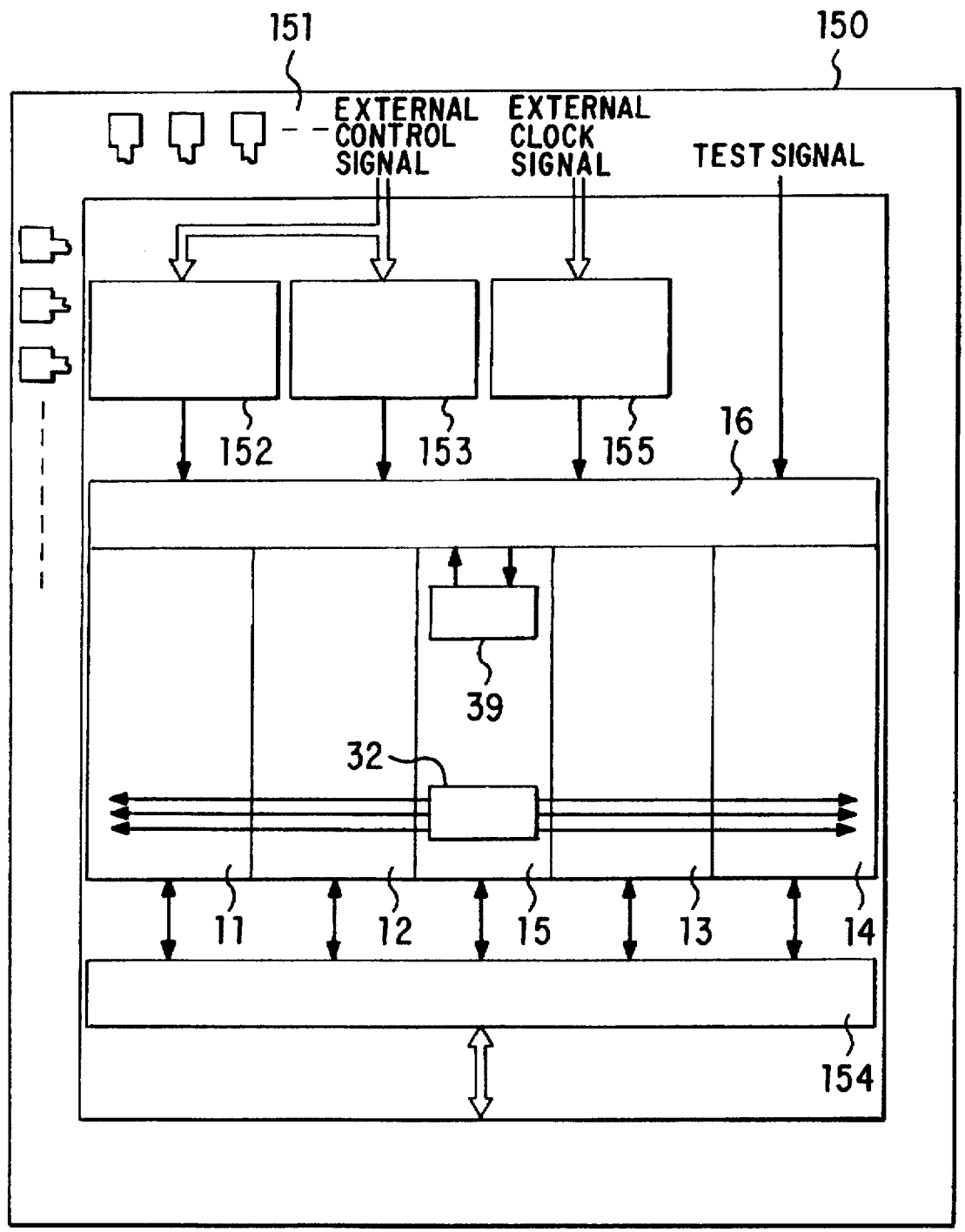
FIG. 13 is a block diagram showing a chip having a control-section macro of the type shown in FIG. 8.

FIG. 13 is a block diagram showing a chip which has a control-section macro including, like the macro shown in FIG. 8, a test circuit and a DC potential generating circuit, and which has four sub-memory macros of DRAM structure.

A pad-I/O (input/output) section 151 is provided on the peripheral portion of the semiconductor chip 150. Arranged inside the pad-I/O section 151 are a memory control signal generating circuit 152, a memory address input generating circuit 153 and a data-processing circuit 154, each including a gate-array section, and a PLL circuit 155 including a gate array or a macro cell. On the central part of the chip 150, there are provided first to fourth sub-memory macros 11 to 14 and a control-section macro 15. A wiring section 16 is located adjacent to the sub-memory macros and the control-section macro.

The memory-control signal generating circuit 152 generates write-enable signal WE1 and/WE2 and row-address strobe signals/RAS1 and/RAS2, and the like, in accordance with an input signal supplied from a device provided outside the chip. The memory-address input generating circuit 153 generates column-address inputs 1 and 2, row-address inputs 1 and 2, and the like, in accordance with an address input supplied from a device located outside the chip. The dam-processing circuit 154 transfers data between the first to fourth sub-memory macros 11 to 14, on the one hand, and the devices provided outside the chip, on the other hand.

Figure 14:
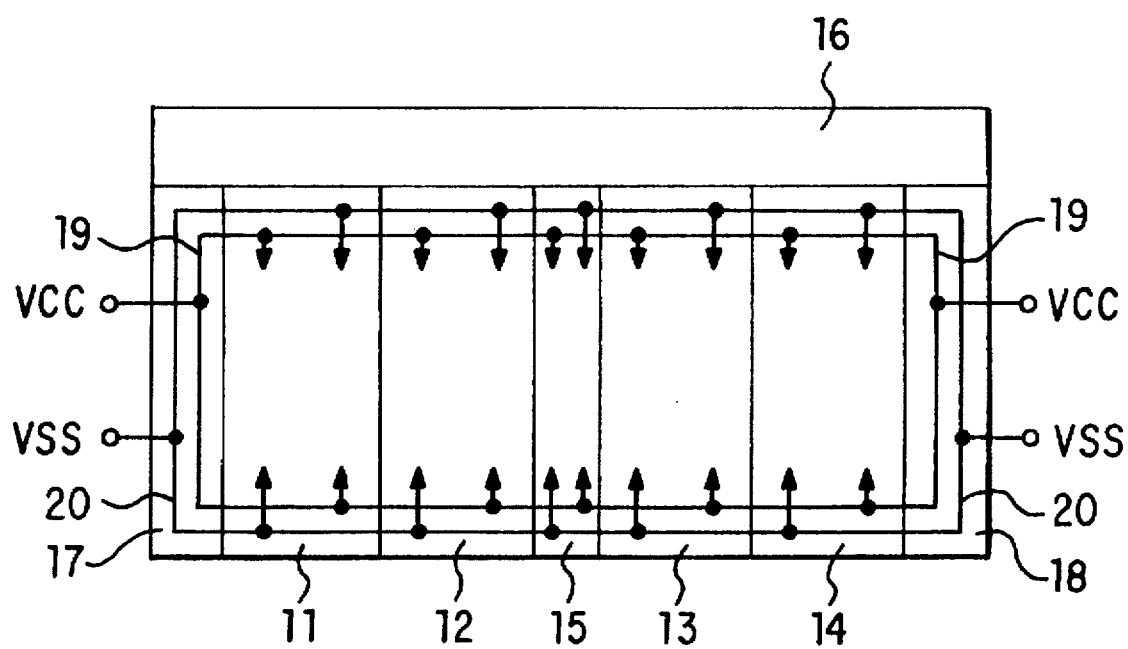
FIG. 14 is a block diagram illustrating the second embodiment of the present invention.
Figure 15:
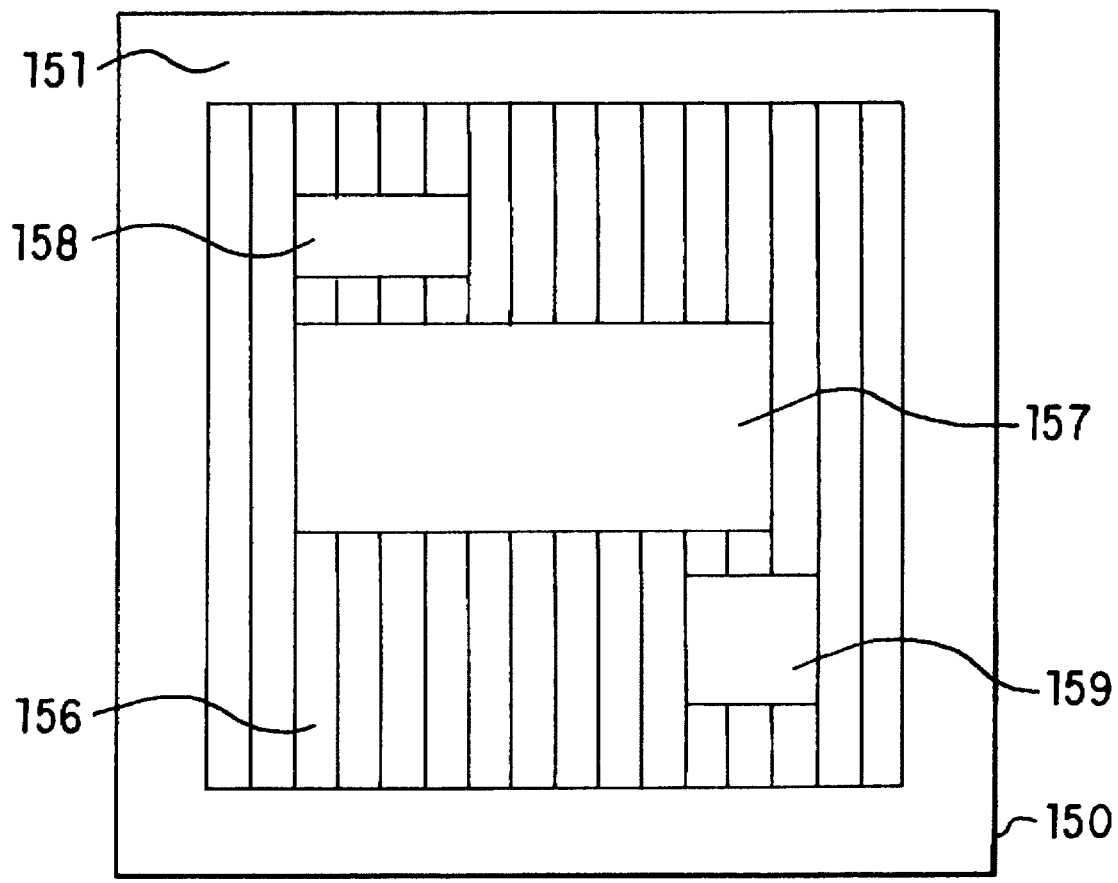
FIG. 15 is a block diagram depicting an embedded memory of a conventional logic semiconductor memory device.
Figure 16:
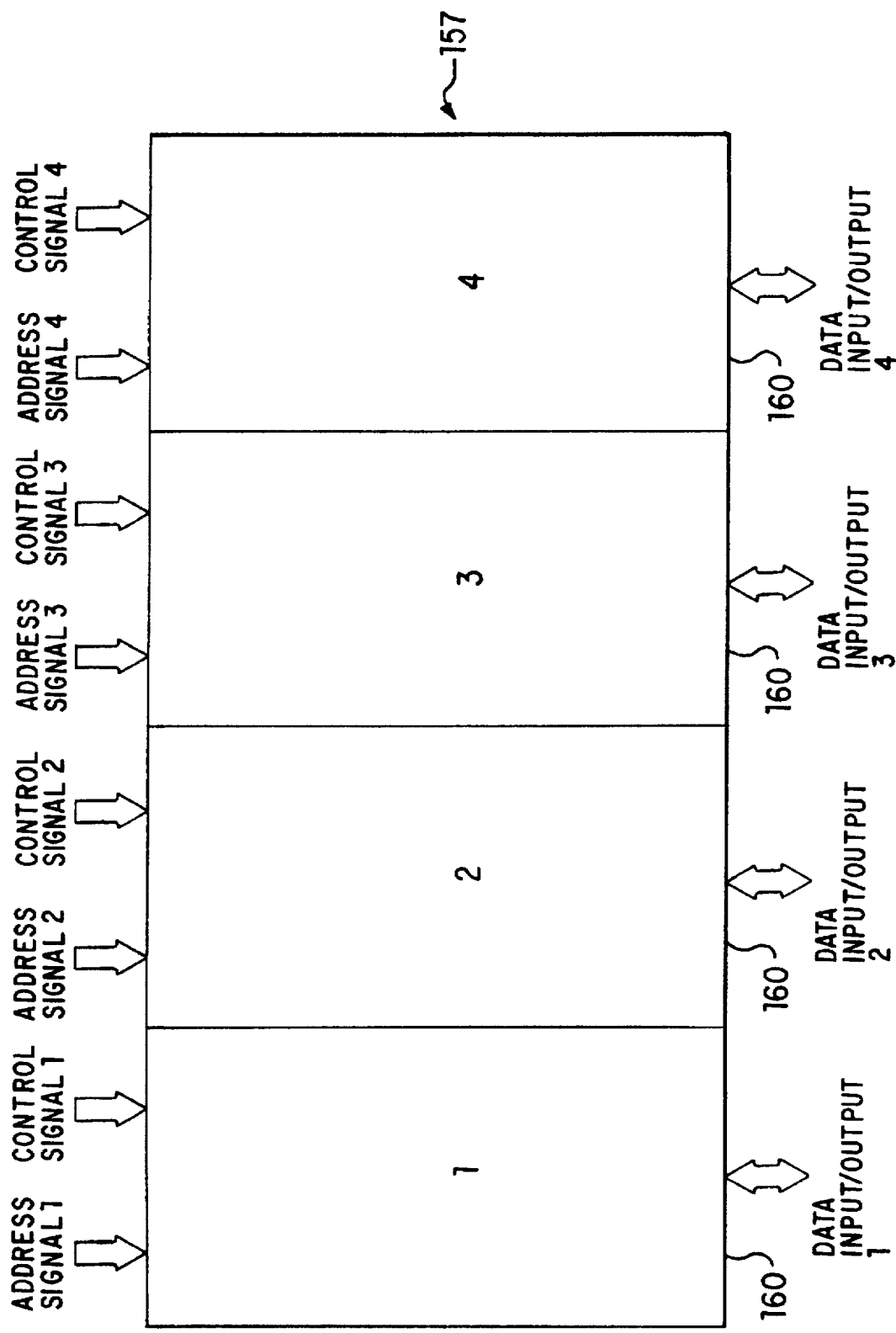
FIG. 16 is a block diagram showing the memory macro illustrated in FIG. 15.
Figure 17:
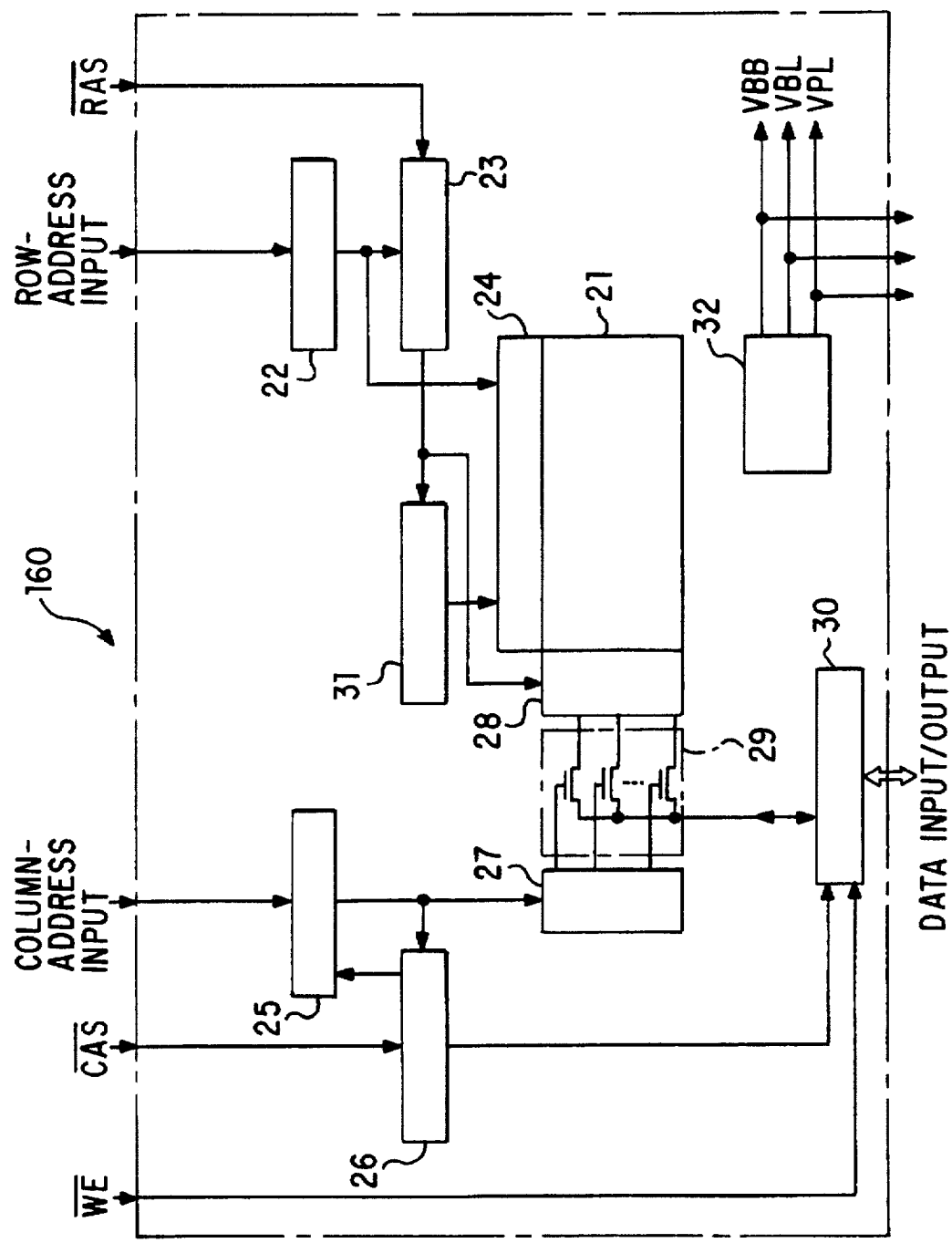
FIG. 17 is a circuit diagram showing one of the sub-memory macros illustrated in FIG. 16.

FIG. 14 is a block diagram showing the second embodiment of the present invention. This embodiment is similar to the embodiment of FIG. 1 which has the first to fourth sub-memory macros 11 to 14, the control-section macro 15 and the wiring section 16. It differs in that power-supply wiring macros 17 and 18 are provided adjacent to the first and fourth sub-memory macros 11 and 14, respectively. The power-supply wiring macros 17 and 18 have a power-supply wire 19 and a ground wire 20, each. These wires 19 and 20 are provided for supplying the power-supply potential VCC and the ground potential VSS, respectively. They have a width greater than the width of other signal wires (the wires provided in the wiring section 16). The power-supply wires 19 and the ground wires 20 included in the power-supply wiring macros 17 and 18 are connected to the power-supply terminal and the ground terminal, respectively.

The power-supply potential VCC and the ground potential VSS are applied to the sub-memory macros 11 to 14 and the control-section 15 through the power-supply wires 19 and the ground wires 20 arranged in the power-supply wiring macros 17 and 18.

Thus, the broad wiring regions for the power-supply potential and the ground potential are provided at the ends of the memory macro, respectively. Therefore, it is possible to reduce noise generated due to the resistance of the wires for applying the power-supply potential and the ground potential, and at the power-supply terminal and the ground terminal in which a current is concentrated, and to mitigate the electromigration effect of the wires.

The first modification shown in FIG. 2 and the second modification shown in FIG. 3 may have power-supply wiring macros which are located at the ends of the memory macro, respectively, as in the second embodiment.

Having described preferred embodiments of a novel semiconductor memory device (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed is:

1. In a semiconductor device having a logic circuit section form either a gate array or standard cells, a memory macro comprising:

at least one sub-memory macro, each sub-memory macro having a memory-cell array with N memory cells capable of storing N bits and a selection circuit for selecting any memory cell of the memory-cell array; and a control-section macro having potential-generating means for generating DC potentials required for driving each sub-memory macro, wherein the at least one sub-memory macro includes a predetermined number of sub-memory macros, the predetermined number of sub-memory macros being combined with the control-section macro to form the memory macro as a one-chip memory capable of storing an integral multiple of N bits.

2. In a semiconductor device having a logic circuit section formed of either a gate array or standard cells, a memory macro comprising:

at least one sub-memory macro, each sub-memory macro having word lines arranged in a row direction, bit lines arranged in a column direction, a memory-cell array capable of storing N bits and formed of N memory cells connected to the word lines and the bit lines, and a selection circuit for selecting any memory cell of the memory-cell array; and a control-section macro having word-line potential generating means for generating a word-line potential to be applied to the word lines of each sub-memory macro, wherein the at least one sub-memory macro includes a predetermined number of sub-memory macros, the predetermined number of sub-memory macros being combined with the control-section macro to form the memory macro as a one-chip memory capable of storing an integral multiple of N bits.

3. In a semiconductor device having a logic circuit section formed of either a gate array or standard cells, a memory macro comprising:

at least one sub-memory macro, each sub-memory macro having a memory-cell array with N memory cells capable of storing N bits, a selection circuit for selecting any memory cell of the memory-cell array, and test-mode switching means for switching, in accordance with a test control signal, from a normal operating mode in which data is written into and read from the memory cells of the memory-cell array, to test mode in which defective cells are detected; and a control-section macro having a test circuit for generating from an input signal the test control signal to determine an operating mode for each sub-memory macro, wherein the at least one sub-memory macro includes a predetermined number of sub-memory macros, the predetermined number of sub-memory macros being combined with the control-section macro to form the memory macro as a one-chip memory capable of storing an integral multiple of N bits.

4. In a semiconductor device having a logic circuit section formed of either a gate array or standard cells, a memory macro comprising:

at least one sub-memory macro, each sub-memory macro having word lines arranged in a row direction, bit lines arranged in a column direction, a memory-cell array capable of storing N bits and formed of N memory cells connected to the word lines and the bit lines, and a selection circuit for selecting any of the memory cells of the memory-cell array; and a control-section macro having DC potential generating means for generating DC potentials required for driving each sub-memory macro, and word-line potential generating means for generating a word-line potential to be applied to the word lines of each sub-memory macro, wherein the at least one sub-memory macro includes a predetermined number of sub-memory macros, the predetermined number of sub-memory macros being combined with the control-section macro to form the memory macro as a one-chip memory capable of storing an integral multiple of N bits.

5. The memory macro according to claim 1 or 4, wherein that the DC potential generating means incorporated in the control-section macro has current-supplying ability set in accordance with the predetermined number of sub-memory macros that are combined with the control-section macro.

6. The memory macro according to claim 2 or 4, wherein the DC potential generating means incorporated in the control-section macro has current-supplying ability set in accordance with the predetermined number of sub-memory macros that combined with the control-section macro.

7. The memory macro according to any one of claims 1 to 4, further comprising a wiring section that is provided adjacent to the predetermined number of sub-memory macros and the control-section macro, the wiring section having wires for connecting the sub-memory macros to the control section macro.

8. The memory macro according to any one of claims 1 to 4, further including a power-supply wiring macro provided adjacent to one of a first sub-memory macro of the sub-memory macros and the control-section macro, the power-supply wiring macro having power-supply wires for supplying a power-supply potential to the predetermined number of sub-memory macros and the control-section macro.

9. The memory macro according to claim any one of claims 1 to 4, wherein the memory cells incorporated in the predetermined number of sub-memory macros are DRAM memory cells.

* * * * *